(12) United States Patent
Weber et al.

(10) Patent No.: US 9,324,474 B2
(45) Date of Patent: Apr. 26, 2016

(54) DISPERSION FOR THE METALLIZATION OF CONTACTINGS

(71) Applicant: Robert Bosch GmbH, Stuttgart (DE)

(72) Inventors: Heribert Weber, Nuertingen (DE); Yvonne Bergmann, Altdorf (DE); Klaus Krueger, Hamburg (DE); Andreas Rathjen, Hamburg (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/554,971

(22) Filed: Nov. 26, 2014

(65) Prior Publication Data

US 2015/0151328 A1    Jun. 4, 2015

(30) Foreign Application Priority Data

Nov. 29, 2013    (DE) .......................... 10 2013 224 622

(51) Int. Cl.
| | |
|---|---|
| *H01B 1/22* | (2006.01) |
| *C09D 11/322* | (2014.01) |
| *H05K 1/09* | (2006.01) |
| *H05K 3/40* | (2006.01) |
| *C09D 11/52* | (2014.01) |
| *H01L 21/283* | (2006.01) |
| *H05K 3/12* | (2006.01) |

(52) U.S. Cl.
CPC .............. *H01B 1/22* (2013.01); *C09D 11/322* (2013.01); *C09D 11/52* (2013.01); *H05K 1/097* (2013.01); *H05K 3/125* (2013.01); *H05K 3/403* (2013.01); *H01L 21/283* (2013.01); *H05K 3/1241* (2013.01); *H05K 3/4053* (2013.01); *H05K 2201/0266* (2013.01); *H05K 2201/09509* (2013.01); *H05K 2201/09845* (2013.01); *H05K 2203/1105* (2013.01)

(58) Field of Classification Search
CPC .............. H01B 1/00; H01B 1/02; H01B 1/22; C09D 5/24
See application file for complete search history.

(56) References Cited

U.S. PATENT DOCUMENTS

| | | | | |
|---|---|---|---|---|
| 2007/0281136 | A1* | 12/2007 | Hampden-Smith | ...... B41M 1/22 428/195.1 |
| 2010/0040846 | A1* | 2/2010 | Bahnmuller | ........... C09D 11/52 428/208 |
| 2012/0315495 | A1* | 12/2012 | Lopez Quintela | ........ C09D 5/24 428/463 |
| 2013/0133934 | A1* | 5/2013 | Flores | ...................... C09D 5/38 174/257 |
| 2014/0221543 | A1* | 8/2014 | Wang | .................... B22F 1/0018 524/403 |

* cited by examiner

*Primary Examiner* — Mark Kopec
(74) *Attorney, Agent, or Firm* — Kenyon & Kenyon LLP

(57) ABSTRACT

A dispersion is provided having a dispersion medium and a plurality of colloid particles finely distributed in the dispersion medium, the colloid particles being electrically conductive, the dispersion being a functional ink for the wetting of an inner wall of a contacting opening of a substrate using a print process.

11 Claims, 6 Drawing Sheets

DISPERSION FOR THE METALLIZATION OF CONTACTINGS

RELATED APPLICATION INFORMATION

The present application claims priority to and the benefit of German patent application no. 10 2013 224 622.6, which was filed in Germany on Nov. 29, 2013, the disclosure of which is incorporated herein by reference.

FIELD OF THE INVENTION

The present invention is based on a dispersion.

BACKGROUND INFORMATION

Dispersions are believed to be generally understood. For example, such dispersions are used in thick- and thin-layer technology for the production of semiconductor components.

SUMMARY OF THE INVENTION

An object of the present invention is to provide a dispersion that has improved wetting characteristics compared to the existing art.

The dispersion according to the present invention, the semiconductor component according to the present invention, and the printer according to the present invention as recited in the coordinate claims have, in comparison to the existing art, the advantage that with the dispersion the production of electrically conductive contactings is improved, because the dispersion has a comparatively small contact angle, so that an improved wetting of the side wall of the contacting opening is ensured. In particular, a dispersion or functional ink is provided that is suitable for the metallization of a via (vertical interconnect access), in particular a silicon via (through silicon via, or TSV). For example, the ink is dispensed onto the substrate through which the contacting is to be made, or is printed onto the substrate using a suitable printing process, for example an inkjet printing process or an aerosol jet method. The colloid particles are an essential part of the dispersion, and particularly may be functional particles, for example silver nanoparticles, that, in sintered form, form an electrically conductive layer.

According to the present invention, wetting of the inner wall of the contacting opening of the substrate using a printing process arrangement that the ink either completely fills the contacting opening, or partly or completely wets only the inner wall, or side wall, of the contacting opening. The overall inorganic solid material portion of the dispersion may be between 1% and 80%, which may be between 10% and 50%.

A special property of the dispersion, or functional ink, according to the present invention is that the ink covers the entire side wall of the via with silver particles in homogenous fashion. This is achieved through a special composition of the ink, such that a dispersant of the dispersion brings about the formation of a comparatively small contact angle, or wetting angle, of the dispersion on the substrate (i.e. the inner wall of the contacting opening). In this way, a good wetting of the inner wall is achieved, so that a comparatively homogenous coating of the inner wall with the colloid particles, for example silver nanoparticles, can be achieved. The dispersant may be configured, with regard to its rheological and drying properties, in such a way that the ink on the one hand penetrates far enough into the via, and on the other hand a fast drying is achieved.

In particular, the present invention enables the metallization of a via, in particular a silicon via (TSV), in a particularly efficient and low-cost manner, even when the via has a comparatively high aspect ratio. A conductive layer, or a conductive material for the realization of a low-ohmic via, may be formed from the dispersion introduced into the contacting opening. Advantageously, control information produced using computer-aided design (CAD) can be transmitted to a printer in order to control particular regions on the substrate surface and to print the dispersion in these regions in a targeted manner. In this way, for example printed conductors and/or bonding pads and/or vias can be printed onto a wafer selectively. The substrate is for example a silicon substrate, a plastic substrate, a glass substrate, or a ceramic substrate.

Advantageous embodiments and developments of the present invention are provided by the descriptions herein, and from the description with reference to the drawings.

According to an exemplary embodiment, it is provided that a particle size distribution of the colloid particles in the dispersion medium is a bimodal or multimodal particle size distribution.

In this way, it is advantageously possible to set the dispersion in a targeted manner onto the surface to be wetted in such a way that the dispersion has a suitable wetting characteristic. The use of a bimodal or multimodal size distribution advantageously makes it possible that, even at comparatively low sintering temperatures, for example below 500° C., which may be below 450° C., a welding is achieved without complete fusion of the colloid particles. Through sintering, the applied colloid particles, dispersants, and/or other nanoparticles are compacted and/or fused in such a way that an electrical resistance is achieved that is as low as possible, and an adhesion to the substrate is achieved.

According to a further development, it is provided that the particle size distribution has a first maximum at a first particle size of the colloid particles, the first particle size being between 1 nm and 100 nm, which may be between 20 nm and 80 nm, particularly between 40 nm and 60 nm, quite particularly approximately 50 nm. According to a further development, it is provided that the particle size distribution has a second maximum at a second particle size of the colloid particles, the second particle size being between 200 nm and 400 nm, which may be between 250 nm and 350 nm, particularly between 290 nm and 310 nm, quite particularly approximately 300 nm.

In this way, it is advantageously possible for the particle size to be specified in a targeted manner in such a way that an electrically conductive contacting can be produced in a substrate from the functional ink using a printing process. The colloid particles, or nanoparticles, of a homogenous particle size distribution fuse comparatively strongly during the sintering, which can result in a formation of cavities and flaws. Due to the bimodal or multimodal size distribution, a comparatively good welding of the colloid particles is achieved without the occurrence of massive fusion.

According to a further development, it is provided that the colloid particles have a silver material, gold material, or copper material.

In this way, it is advantageously possible that an electrically conductive layer produced through sintering of the dispersion has a comparatively high conductance value. The electrically conductive layer may have a portion of the electrically charged colloid particles that, after a sintering process, form the electrically conductive layer, which is in particular homogenous, having a comparatively high conductance value. In addition, further ingredients can optionally be mixed into the ink in a targeted manner for adaptation to the thermal coefficients of expansion of silicon and in order to improve the long-term stability (change of temperature) of the TSVs.

According to a further development, it is provided that the dispersion has a viscosity between 1 mPas and 100 mPas, which may be between 3 mPas and 50 mPas, particularly between 5 mPas and 20 mPas.

In this way, it is advantageously possible to provide a functional ink that is suitable for the complete filling, or at least partial filling, of the contacting opening, and that can be processed in a printing process. In particular, the viscosity of the ink is adapted such that a printable ink is present that may have the viscosity at a typical processing temperature. In the case of a non-Newtonian ink, the ink has the viscosity at shear rates that are typical for the processing, for example a shear rate of $1000\ s^{-1}$. The viscosity may be a function of temperature in such a way that the viscosity can be adapted through targeted heating of the dispersion, for example in the print head and/or in a reservoir of an inkjet printer.

According to a development of the component according to the present invention, it is provided that the contacting is situated in a contacting opening of the substrate, the contacting opening having an inner wall, the electrically conductive layer being situated exclusively on an inner wall of the contacting, or completely filling the contacting opening.

In this way, it is advantageously possible to achieve a comparatively good wetting of the side wall of the contacting.

According to a further development of the component according to the present invention, it is provided that the electrically conductive layer has a quadratic resistance between 0.1 mOhm and 100 mOhm, which may be between 1 mOhm and 50 mOhm, particularly between 2 mOhm and 20 mOhm.

In this way, it is advantageously possible to provide an electrically conductive layer that has a comparatively high conductance value, so that comparatively low-ohmic contactings are provided by the dispersion. Here, the surface resistance per quadratic unit is referred to as the quadratic resistance.

According to a further development of the component according to the present invention, it is provided that the contacting is a silicon via.

In this way, it is advantageously possible that, through the use of the dispersion according to the present invention in semiconductor components, the production of metallized contactings having a comparatively high aspect ratio is achieved.

According to an exemplary method according to the invention, it is provided that in the third production step the initial material is introduced into the contacting opening using a printing process, the printing process being in particular an inkjet printing process or an aerosol jet method.

In this way, it is advantageously possible to achieve the production of metallized contactings having a comparatively high aspect ratio in a particularly efficient and simple manner through the use of the dispersion according to the present invention in a printing process.

A further subject matter of the present invention is a method for producing a component having an electrically conductive contacting, a substrate being provided in a first production step, a contacting opening being formed in the substrate in a second production step, a flowable initial material being introduced into the contacting opening using a printing process in a third production step, the electrically conductive contacting being formed from the initial material in a heating process in a fourth production step, a dispersion according to the present invention for the wetting of an inner wall of the contacting opening being used as initial material in the third production step.

Exemplary embodiments of the present invention are shown in the drawings and are explained in more detail in the following description.

DETAILED DESCRIPTION

Figure 1:
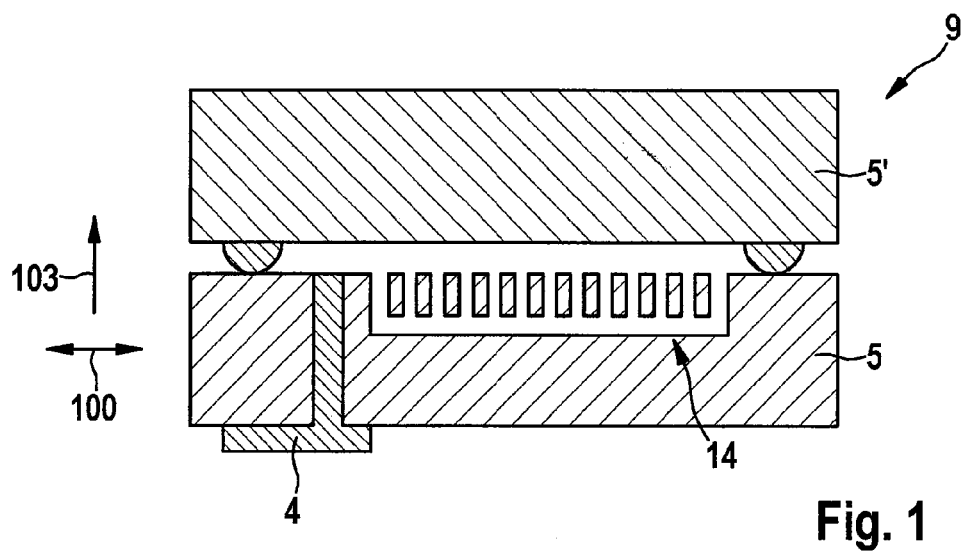
FIGS. 1, 2, 3, 4, and 5 show components according to various specific embodiments of the present invention.

In the various Figures, identical parts are provided with the same reference characters, and are therefore as a rule each named or mentioned only once.

In FIGS. 1 through 5, components 9 are shown according to various specific embodiments of the present invention. In FIG. 1, a component 9 is shown that here has a substrate 5 of a first wafer and a further substrate 5' of a further wafer, the further wafer here being a capping wafer. In addition, component 9 has a micromechanical structure 14 that is also designated a surface micromechanical structure 14, or OMM structure 14. Substrate 5 has a contacting 4. Contacting 4 is designated via 4 if the contacting extends through substrate 5 along a normal direction 103 that is essentially perpendicular to main plane of extension 100 of substrate 5. Here, contacting 4 is an electrically conductive contacting 4. For the development of ever-smaller micro-electromechanical components 9 (MEMS components), the stacking and through-contacting of the individual elements, in particular of the sensor, the sensor cap, and/or the integrated circuit is provided, through the production of vias 4, in particular silicon vias 4. This is also referred to as MEMS 3D integration.

Figure 2:
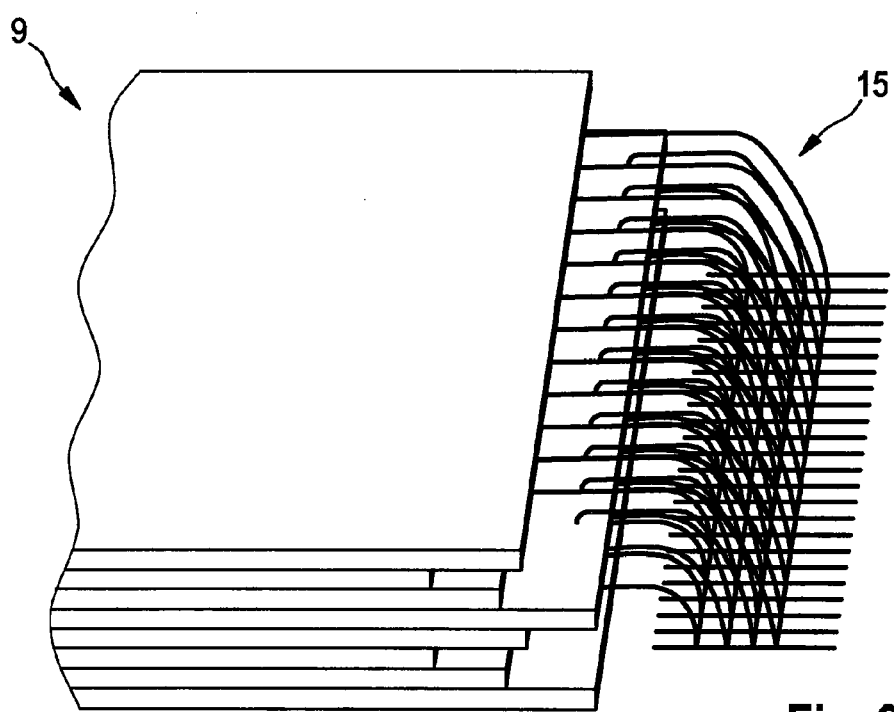
Figure 3:
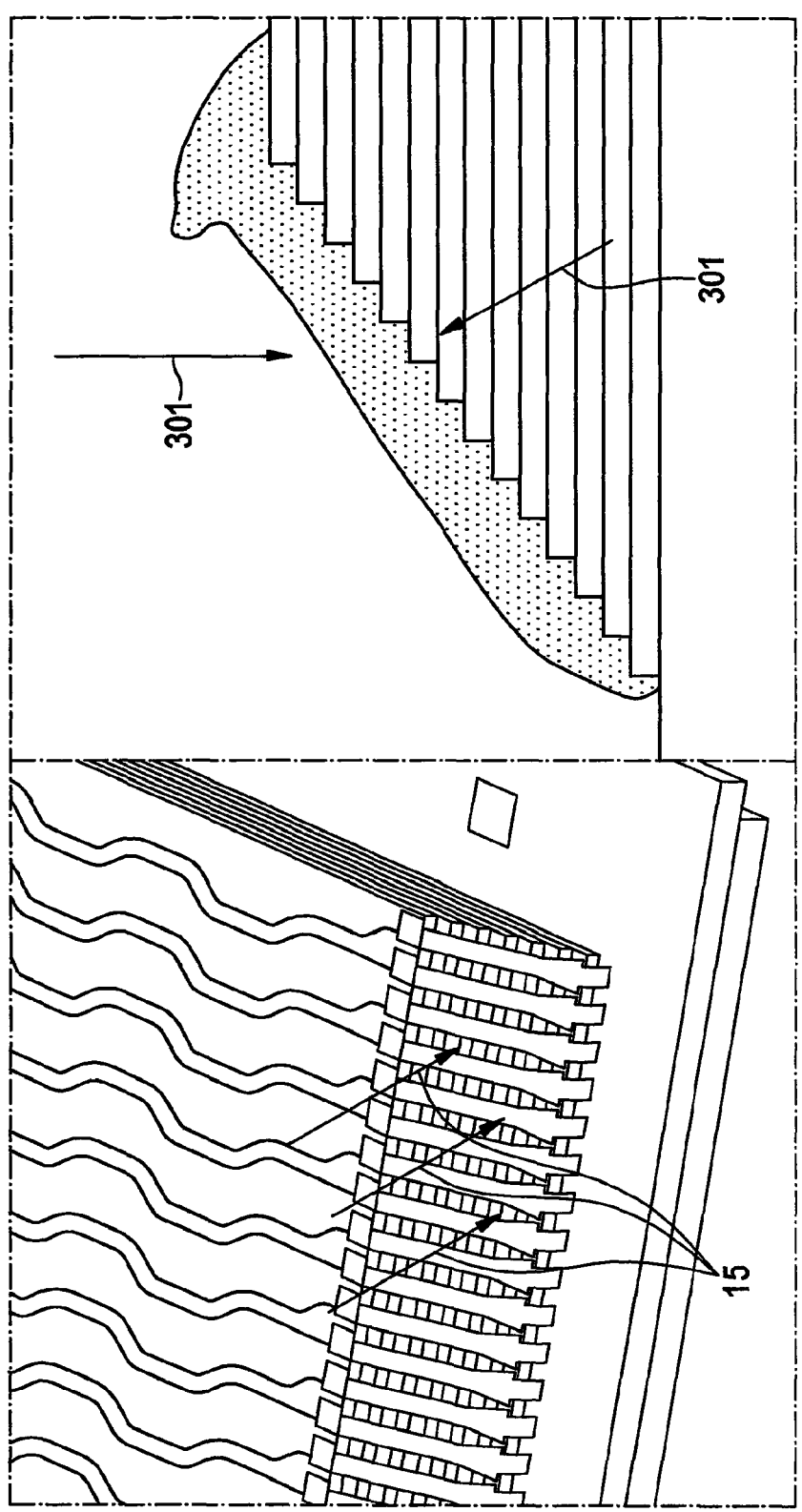
Figure 4:
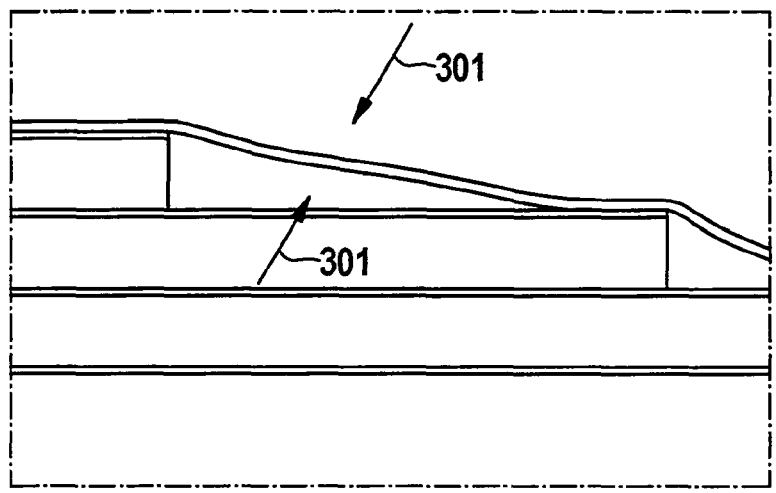
Figure 5:
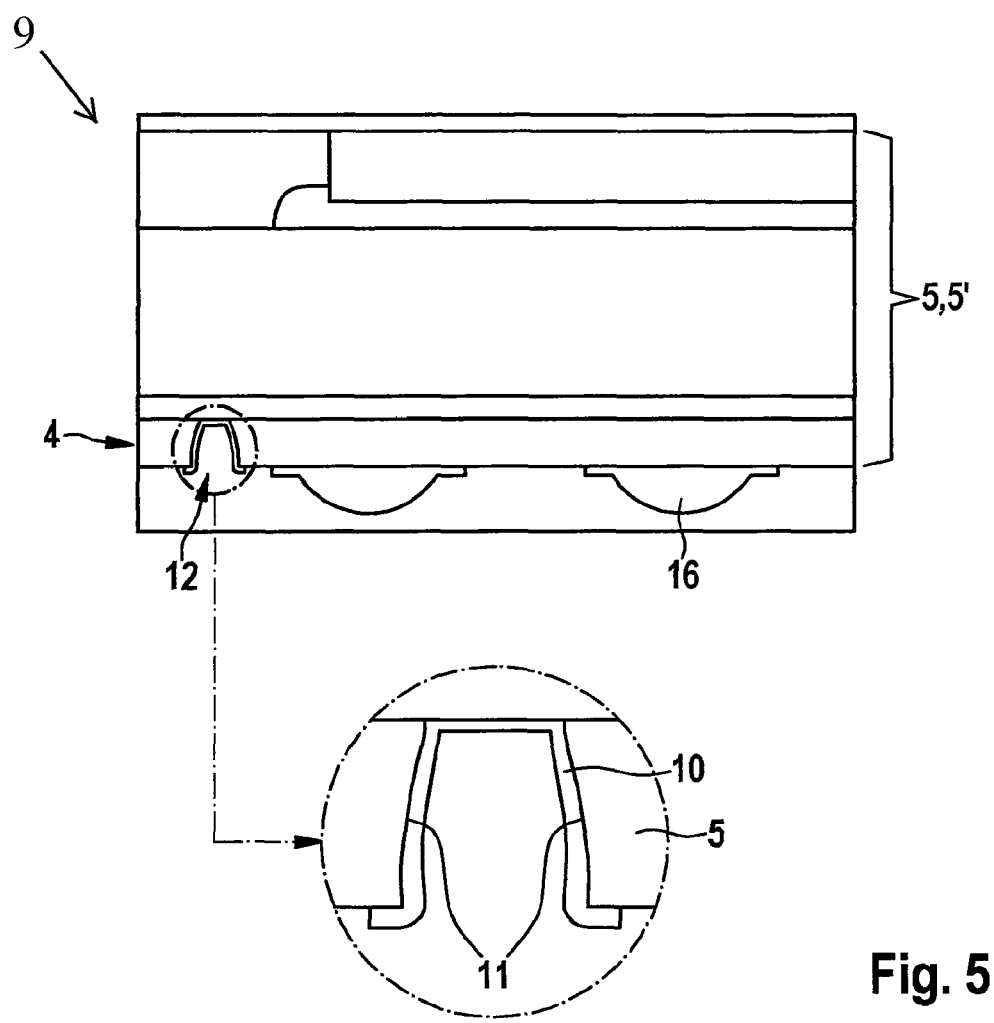

FIG. 2 shows a component 9 fashioned as a stacked memory chip having bonding wires 15 formed by the printing of silver printed conductors. Here, printed conductors for the creation of bonding wires 15 are produced over steps of different memory chip levels. In FIGS. 3 and 4, components 9 are shown, components 9 having electrically conductive connections produced in a silver printing process (indicated by arrows 301). In FIG. 3, the silver printing process includes a silver epoxy printing method, and in FIG. 4 the silver printing process includes a so-called aerosol jet method. In FIG. 5 a component 9 is shown that includes a substrate stack 5, 5' and contact arrangement 16. Here, substrate 5 of component 9 has a contacting 4 that is situated in a contacting opening 12 of substrate 5 and that has an electrically conductive layer 10 that is situated on an inner wall of 11 of contacting opening 12.

Figure 6:
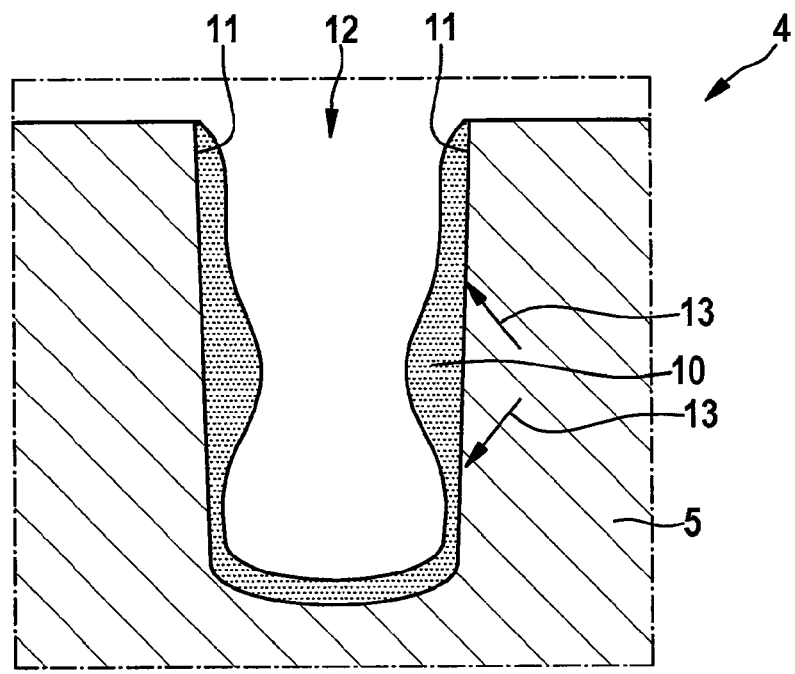
FIGS. 6 and 7 show contactings according to various specific embodiments of the present invention.
Figure 7:
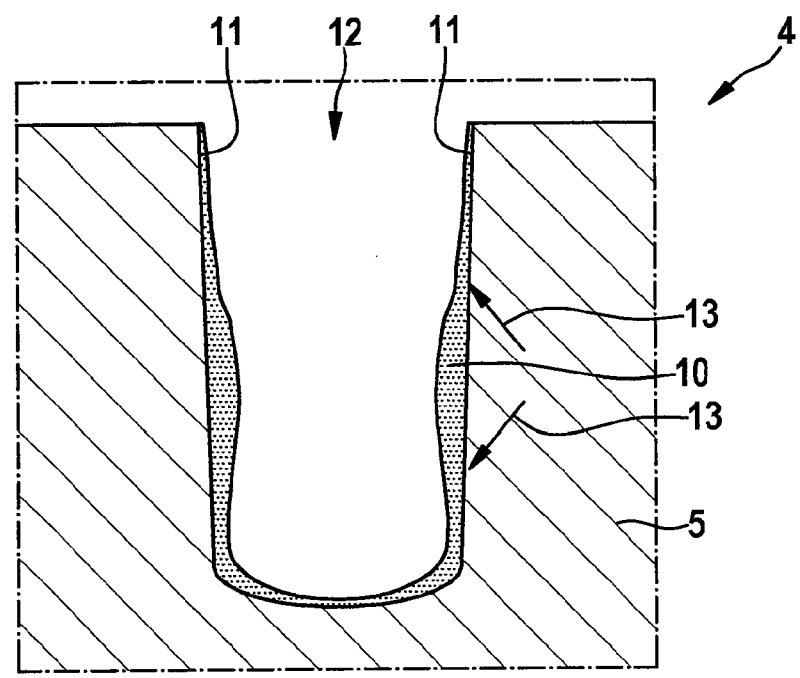

In FIGS. 6 and 7, contactings 4 are shown according to various specific embodiments of the present invention. Here, substrate 5 has a contacting opening 12 having an inner wall 11 and an electrically conductive layer 10, electrically conductive layer 10 extending at least partly or completely along inner wall 11. Here, electrically conductive layer 10 is made up of a sintered dispersion 1 according to the present invention. Optionally, an oxide layer 13 is situated between electrically conductive layer 10 and inner wall 11.

Substrate 5 may be a silicon substrate 5 of a silicon wafer, and electrically conductive layer 10 is a silver layer, and/or oxide layer 13 is a tetraethyl orthosilicate (TEOS) oxide layer. Silver layer 10 may be essentially made up of colloid particles 3 of dispersion 1. Here, via 4 is in particular a silicon via, also referred to as a through silicon via (TSV).

In particular, via 4 of component 90 according to the present invention is produced by inkjet printing or screen printing, the conductive ink 1 or dispersion 1 according to the present invention being introduced into a via opening 12, or via hole 12, etched into substrate 5. Here, a contacting opening 12 is etched into a substrate 5 of a silicon wafer for example in a dry etching method. Using chemical gas phase deposition (CVD process), subsequently inner wall 11, here also referred to as side wall 11, is isolated through deposition of an oxide layer 13, and oxide layer 13 is subsequently removed in a floor region of contacting opening 12 by dry etching. In a subsequent step, functional ink 1 is introduced into contacting opening 12 using an ink jet printing process, and is subsequently sintered. The specific embodiments shown in FIGS. 6 and 7 differ in the quantity of introduced dispersion 1 and in the sintering temperature. Optionally, after the metallization of inner wall 11 via 12 is filled with non-conductive particles (e.g. $SiO_2$, $Si_3N_4$, $Al_2O_3$) or with polymer material.

By exploiting the wetting properties of electrically conductive ink 1, in a targeted manner particular regions are metallized in and on substrate 5, for example inner wall 11 of contacting opening 12. In particular, care is to be taken here that the metal is filled into contacting opening 12 without cavities in order to ensure low electrical resistance, good adhesion, and good further processability.

Figure 8:
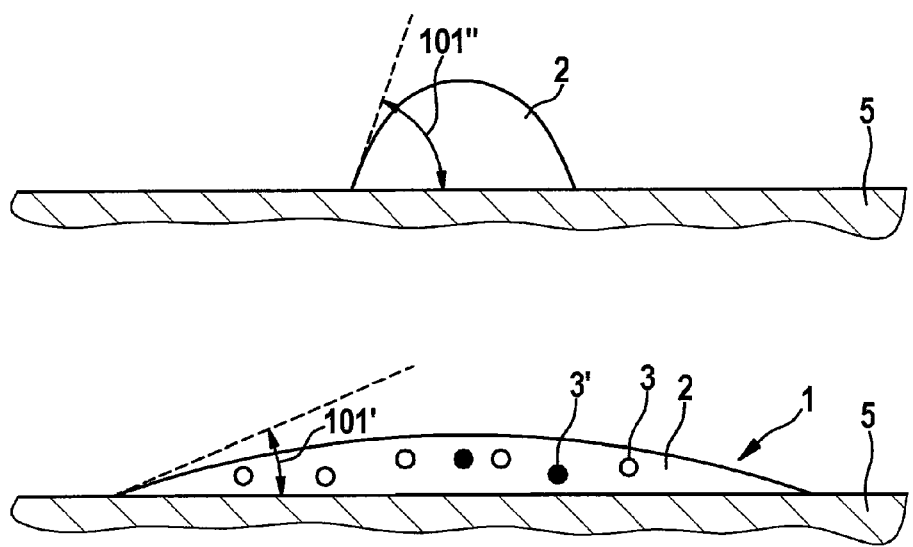
FIG. 8 shows dispersion drops in a schematic view.

FIG. 8 shows dispersion drops in a schematic view. At the bottom of FIG. 8, a dispersion drop 1 applied on a substrate 5 is shown having dispersion 1 according to the present invention, with dispersion medium 2 and colloid particles 3 dispersed in dispersion medium 2. The dispersion may additionally contain dispersant particles 3'. At the top in FIG. 8, a further dispersion drop applied on the same substrate is shown, which however has only dispersion medium 2 without colloid particles 3 and/or dispersant particles 3'. Contact angle 101', or wetting angle 101', of the dispersion drop is here smaller than a further contact angle 101", or further wetting angle 101", of the further dispersion drop.

Figure 9:
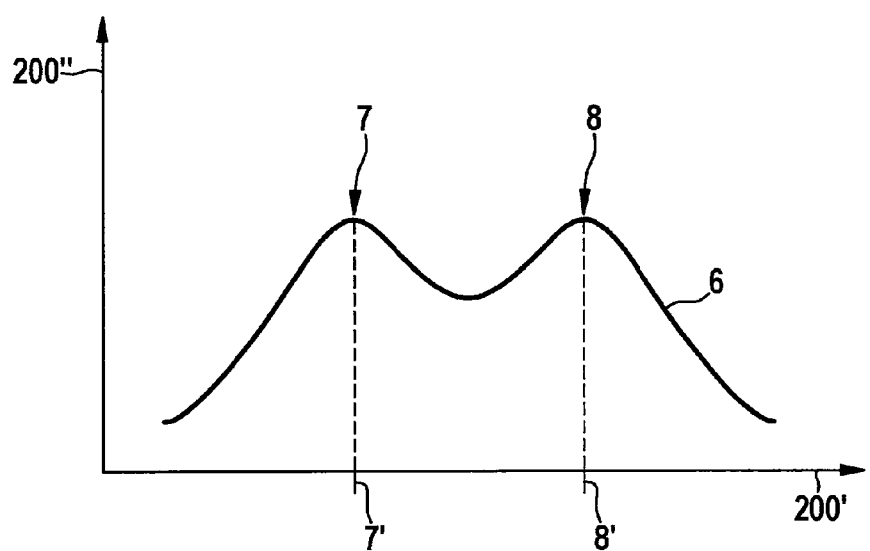
FIG. 9 shows a particle size distribution.

FIG. 9 shows as an example a particle size distribution 6 that describes, in a qualitative representation, the distribution 200" of particle sizes 200' of colloid particles 3 and/or dispersant particles 3' and/or further particles of dispersion 1. Here, particle size distribution 6 has a first maximum 7 at a first particle size 7' and has a second maximum 8 at a second particle size 8' (bimodal particle size distribution). Dispersion 1 can also have more than two maxima 7, 8 (multimodal particle size distribution).

Figure 10:
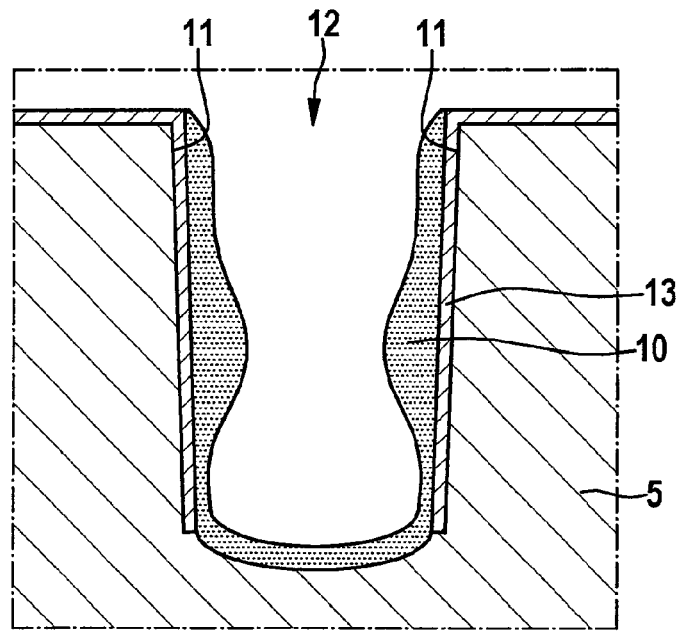
FIG. 10 shows a contacting opening according to a specific embodiment of the present invention.

FIG. 10 shows a contacting opening 12 according to a specific embodiment of the present invention. Here, contacting opening 12 extends into substrate 5. Oxide layer 13 is applied on inner wall 11 of contacting opening 12. Electrically conductive layer 10 formed from dispersion 1 is applied on oxide layer 13. In the representation according to FIG. 10, electrically conductive layer 10 meets the upper edge of contacting opening 12. Alternatively, according to the present invention it may be provided that electrically conductive layer 10, as shown in the enlarged segment in FIG. 5, extends past the edge of contacting opening 12, or covers, which may be completely, the edge of contacting opening 12.

Figure 11:
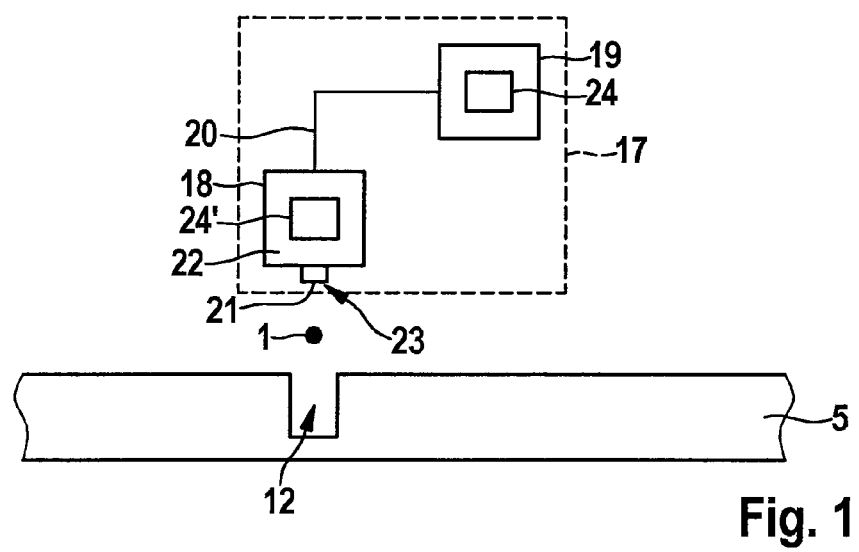
FIG. 11 shows a printer according to a specific embodiment of the present invention.

FIG. 11 shows a printer 17 according to a specific embodiment of the present invention, in a schematic view. Printer 17 may be configured for the application of a dispersion 1 according to the present invention on a substrate 5. Here, printer 17 has a print head device 18 having a nozzle 21, a chamber 22, and an opening 23 for the emission of dispersion drops 1 from chamber 22. In addition, the printer has a reservoir device 19 for storing dispersion 1 and a supply device 20 for supplying dispersion 1 to chamber 22 from reservoir device 19.

Printer 17 may have a heating device 24, 24' that has a sub-heating device 24 configured for the heating of dispersion 1 in reservoir device 19, and/or a further sub-heating device 24' configured for the heating of dispersion 1 in chamber 22. Here, printer 17 is configured in such a way that a dispersion drop 1 having dispersion 1 can be filled into contacting opening 12.

Dispersion drop 1 produced by printer 17 may have a drop size of between 5 picoliters (pL) and 100 pL.

In particular, printer 17 is configured such that electrically conductive structures are produced having a structural width of between 20 and 500 μm. In this way it is for example advantageously possible to produce resistors, inductors, printed conductors, capacitors, etc. on substrate 5 using a printing process. In addition, it is for example provided according to the present invention to use conductive or non-conductive ink for a multilayer printing (e.g. multilayer metallization). Here, it is advantageous if the ink that wets substrate 5 has a comparatively high further contact angle 101". For the metallization of silicon vias 4, it may be however that contact angle 101' is relatively small (see FIG. 8, bottom), so that a comparatively good wetting is achieved of inner wall 11 of via opening 12.

In particular, the dispersion has further additives for improving the sedimentation characteristics (e.g. preventing the sinking of the particles in the ink reservoir), and/or for preventing clogging of the nozzle or a non-homogenous drop composition.

Dispersants may include for example isopropanol, ethylene glycol, diethylene glycol mono butyl ether, butyl glycol, or terpineol, as well as mixtures thereof. In particular the use of highly pure water, for example DI water, is also possible.

What is claimed is:
1. A dispersion, comprising:
a dispersion medium; and
colloid particles dispersed in the dispersion medium;
wherein the colloid particles are electrically conductive,
wherein the dispersion is a functional ink for wetting an inner wall of a contacting opening of a substrate using a printing process,
wherein a particle size distribution of the colloid particles in the dispersion medium is a bimodal particle size distribution,
wherein the particle size distribution has a first maximum at a first particle size of the colloid particles, the first particle size being between 1 nm and 100 nm, and
wherein the particle size distribution has a second maximum at a second particle size of the colloid particles, the second particle size being between 290 nm and 310 nm.

2. The dispersion of claim 1, wherein a particle size distribution of the colloid particles in the dispersion medium is a multimodal particle size distribution.

3. The dispersion of claim 2, wherein the particle size distribution has a second maximum at a second particle size of the colloid particles, the second particle size being between 200 nm and 400 nm.

4. The dispersion of claim 2, wherein the particle size distribution has a first maximum at a first particle size of the colloid particles, the first particle size being between 20 nm and 80 nm.

5. The dispersion of claim 2, wherein the particle size distribution has a first maximum at a first particle size of the colloid particles, the first particle size being between 40 nm and 60 nm.

6. The dispersion of claim 2, wherein the particle size distribution has a first maximum at a first particle size of the colloid particles, the first particle size being approximately 50 nm.

7. The dispersion of claim 2, wherein the particle size distribution has a second maximum at a second particle size of the colloid particles, the second particle size being approximately 300 nm.

8. The dispersion of claim 1, wherein the colloid particles have a silver material, gold material, or copper material.

9. The dispersion of claim 1, wherein the dispersion has a viscosity between 1 millipascal-second (mPas) and 100 mPas.

10. The dispersion of claim 1, wherein the dispersion has a viscosity between 3 millipascal-second (mPas) and 50 mPas.

11. The dispersion of claim 1, wherein the dispersion has a viscosity between 5 millipascal-second (mPas) and 20 mPas.

\* \* \* \* \*